(12) United States Patent
Mohn et al.

(10) Patent No.: US 11,538,734 B2
(45) Date of Patent: Dec. 27, 2022

(54) POWER SEMICONDUCTOR PACKAGE WITH HIGHLY RELIABLE CHIP TOPSIDE

(71) Applicant: Hitachi Energy Switzerland AG, Baden (CH)

(72) Inventors: Fabian Mohn, Ennetbaden (CH); Alexey Sokolov, Baden (CH); Chunlei Liu, Oberrohrdorf (CH)

(73) Assignee: Hitachi Energy Switzerland AG, Baden (CH)

( * ) Notice: Subject to any disclaimer, the term of this patent is extended or adjusted under 35 U.S.C. 154(b) by 275 days.

(21) Appl. No.: 17/046,620

(22) PCT Filed: Apr. 8, 2019

(86) PCT No.: PCT/EP2019/058748
§ 371 (c)(1),
(2) Date: Oct. 9, 2020

(87) PCT Pub. No.: WO2019/197304
PCT Pub. Date: Oct. 17, 2019

(65) Prior Publication Data
US 2021/0104449 A1 Apr. 8, 2021

(30) Foreign Application Priority Data
Apr. 11, 2018 (EP) ..................................... 18166775

(51) Int. Cl.
*H01L 23/373* (2006.01)
*H01L 21/48* (2006.01)
*H01L 23/00* (2006.01)

(52) U.S. Cl.
CPC ...... *H01L 23/3735* (2013.01); *H01L 21/4871* (2013.01); *H01L 23/562* (2013.01)

(58) Field of Classification Search
CPC ... H01L 23/562; H01L 23/3735; H01L 24/49; H01L 24/48; H01L 21/4871; H01L 24/45;
(Continued)

(56) References Cited

U.S. PATENT DOCUMENTS 5,300,458 A 4/1994 Kuhnert et al.
8,299,588 B1 * 10/2012 Tateishi ............ H01L 23/49575
257/676

(Continued)

FOREIGN PATENT DOCUMENTS

DE 102014008587 A1 12/2015
DE 102014222819 A1 5/2016
(Continued)

OTHER PUBLICATIONS

Haumann, Siegbert, et al., "Novel Bonding and Joining Technology for Power Electronics", Proceedings of APEC 2013 conference, pp. 622-626.

*Primary Examiner* — Mouloucoulaye Inoussa
(74) *Attorney, Agent, or Firm* — Slater Matsil, LLP (57) ABSTRACT

A power semiconductor module includes a substrate with a metallization layer and a power semiconductor chip bonded to the metallization layer of the substrate. A metallic plate has a first surface bonded to a surface of the power semiconductor chip opposite to the substrate. The metallic plate has a central part and a border that are both bonded to the power semiconductor chip. The border of the metallic plate is structured in such a way that the metallic plate has less metal material per volume at the border as compared to the central part of the metallic plate. Metallic interconnection elements are bonded to a second surface of the metallic plate at the central part.

20 Claims, 4 Drawing Sheets

(58) Field of Classification Search
CPC ......... H01L 24/85; H01L 24/33; H01L 24/83;
H01L 24/32; H01L 24/29; H01L
23/49503; H01L 23/49524; H01L
21/02491; H01L 23/49575; H01L
23/4093; H01L 23/49513; H01L 21/02;
H01L 23/49548; H01L 23/49562; H01L
24/69; H01L 24/92; H01L 24/84; H01L
24/37; H01L 24/73; H01L 23/49517;
H01L 23/49565; H01L 24/41; H01L
24/40; H01L 23/49866; H01L 25/07;
H01L 23/28; H01L 23/49894; H01L
25/18; H01L 23/49861; H01L 23/3121;
H01L 23/48; H01L 23/49838; H01L
24/03
USPC ....... 257/777, 795, 675, 713, 687, 690, 684,
257/676, 666, 686, 737, 706, 707, 712,
257/738, 718, 719, 788, 782, 23.031,
257/23.129; 438/127, 109, 122, 125, 613,
438/126
See application file for complete search history.

(56) References Cited

U.S. PATENT DOCUMENTS

| | | | | |
|---|---|---|---|---|
| 9,601,453 B2* | 3/2017 | Hebert | ............... | H01L 23/4951 |
| 2006/0233012 A1* | 10/2006 | Sekiguchi | ............... | G11C 5/02 |
| | | | | 365/51 |
| 2007/0090496 A1* | 4/2007 | Otremba | ........... | H01L 23/49562 |
| | | | | 257/676 |
| 2007/0246833 A1* | 10/2007 | Soga | ....................... | H01L 23/24 |
| | | | | 257/772 |
| 2008/0305584 A1* | 12/2008 | Foong | .................. | H01L 21/565 |
| | | | | 165/185 |
| 2009/0261462 A1* | 10/2009 | Gomez | ............ | H01L 23/49541 |
| | | | | 438/109 |
| 2011/0049580 A1* | 3/2011 | Lui | ................... | H01L 23/49575 |
| | | | | 257/E21.705 |
| 2012/0063107 A1* | 3/2012 | Krishnan | .................. | H05K 7/00 |
| | | | | 361/783 |
| 2013/0027113 A1* | 1/2013 | Otremba | ........... | H01L 23/49562 |
| | | | | 257/E21.705 |
| 2015/0001692 A1* | 1/2015 | Tsai | .................. | H01L 23/49575 |
| | | | | 257/666 |
| 2015/0279821 A1* | 10/2015 | Cho | .................. | H01L 23/49537 |
| | | | | 257/288 |
| 2015/0357303 A1* | 12/2015 | Kohl | ....................... | H01L 24/33 |
| | | | | 438/123 |
| 2016/0086877 A1* | 3/2016 | Mikado | ............... | H01L 23/4951 |
| | | | | 257/676 |
| 2017/0317049 A1 | 11/2017 | Becker et al. | | |
| 2018/0053737 A1* | 2/2018 | Ogawa | .................... | H01L 24/03 |

FOREIGN PATENT DOCUMENTS

| | | |
|---|---|---|
| EP | 0520294 A1 | 12/1992 |
| JP | H01122129 A | 5/1989 |
| JP | 2000307043 A | 11/2000 |
| JP | 2012028674 A | 2/2012 |
| JP | 2017005037 A | 1/2017 |
| WO | 2017157486 A1 | 9/2017 |

* cited by examiner

POWER SEMICONDUCTOR PACKAGE WITH HIGHLY RELIABLE CHIP TOPSIDE

CROSS-REFERENCE TO RELATED APPLICATIONS

This application is a national stage application of International Application No. PCT/EP2019/058748, filed on Apr. 8, 2019, which application claims priority to European Patent Application No. 181667750.9, filed on Apr. 11, 2018, which applications are hereby incorporated herein by reference.

FIELD OF THE INVENTION

The invention relates to a power semiconductor module and to a method for manufacturing a power semiconductor module.

BACKGROUND OF THE INVENTION

To make use of the high-temperature capability and high power density of the newest generations of silicon (Si) and silicon carbide (Sic) power semiconductor devices, advanced packaging and interconnection technologies are needed to provide sufficient reliability and current capability.

Usually, power semiconductor devices, such as rectifiers and inverters, are assembled of one or more power semiconductor modules, which provide the housing and/or electrical interconnection of one or more power semiconductor chips. The topside interconnection of the power semiconductor chips often limit the lifetime of the power semiconductor modules in applications with high cycling requirements.

One possibility is to bond a metallic plate to a top side of the semiconductor chip and to bond the electrical interconnections to the metallic plate. This, for example, is shown in EP 0520 294 A1.

However, due to the mismatch of the coefficient of thermal expansion between the metallic plate and the power semiconductor chip, there may be a considerable stress exerted on the bond interface between the power semiconductor chip and the metallic plate during active or passive thermal cycling. This stress may lead to a degradation of the bond layer and/or chip metallization, which eventually may limit the lifetime of the interconnection. This may become even more severe, when SiC power semiconductor chips are used, due to the different mechanical properties of the SiC material causing increased thermomechanical stress.

In order to minimize the stress caused by the thermal mismatch and maximize the cycling lifetime, one would try to use a metallic plate, which is as thin as possible. However, this may have disadvantages regarding the wire bonding process. With a thin metallic top plate, losses due to damaged chip topside structures may be present, which are caused by high forces and power generated during the wire bonding process. Another disadvantage of very thin metallic top plates may be that these parts become difficult to handle.

U.S. 2007/246 833 A1 shows a metal plate, which is bonded to a semiconductor chip. The metal plate has a border, which is thinner than a central part that is used for bonding bond wires.

JP 2000 307 043 A shows a metal plate, which has a border that is thinner than a central part, to which an electrical conductor is attached.

U.S. 2018/053,737 A1 shows metal layers on a semiconductor chip, which have a border that is thinner than a central part, where a bond wire is attached.

WO 2017/157,486 A1 relates to a semiconductor device and mentions several possibilities, how components on a semiconductor chip can be bonded with each other and machined, such as sintering, etching and stamping.

JP H01 122 129 A shows metal pads with holes for wire bonding.

DESCRIPTION OF THE INVENTION

It is an objective of the invention to provide a power semiconductor module with a highly reliable electric interconnection on the power semiconductor chip, which is easy and economical to manufacture.

This objective is achieved by the subject-matter of the independent claims. Further exemplary embodiments are evident from the dependent claims and the following description.

An aspect of the invention relates to a power semiconductor module. A power semiconductor module, which also may be called power semiconductor package, may provide the mechanical and/or electrical interconnection of one or more power semiconductor chips. Furthermore, the power semiconductor module may comprise a housing for the one or more power semiconductor chips and/or the electrical interconnection.

It has to be noted that the term power here and in the following may relate to devices (i.e. modules and/or chips), which are designed for processing currents of more than 10 A and/or more than 100 V.

According to an embodiment of the invention, the power semiconductor module comprises a substrate with a metallization layer, a power semiconductor chip bonded to the metallization layer of the substrate, and a metallic plate bonded with a first surface to the power semiconductor chip opposite to the substrate. The power semiconductor chip may be bonded to a substrate, the metallic top plate may be bonded to the topside of the power semiconductor chip.

The metallic plate has a central part and a border, which are both bonded to the power semiconductor chip. The border may be provided at an edge of the metallic plate and/or may surround the central part.

The metallic plate may have two opposite surfaces, i.e. a first, lower surface and a second, upper surface. Both surfaces may be flat. The metallic plate may be bonded with the complete first surface to the power semiconductor chip. In particular, the central part and/or the border may be bonded with its surface facing the semiconductor chip to this chip.

A plurality of metallic interconnection elements are bonded to a second surface of the metallic plate at the central part. The central part may be used for attaching electrical conductors.

The border of the metallic plate is structured in such a way that the metallic plate has less metal material per area at the border as compared to a central part of the metallic plate. The metallic top plate may have a dedicated structure at the border or periphery to reduce the thermomechanical stress on a bond layer between the metallic plate and the power semiconductor chip and/or on a topside of the power semiconductor chip during thermal cycles.

At the border, the metallic plate may be reduced in metal material. In particular, the metal material per area may be reduced. Here, the term "per area" may refer to an area of the metallic plate defined by viewing onto the metallic plate in a direction orthogonal to the metallic plate, the semiconductor chip and/or the substrate. The border of the metallic plate may be the part of the metallic plate outside a central part of the metallic plate, which central part may be used for bonding electrical interconnection elements. The central part may have a larger area as the border.

Less metal material may be present at the border by removing metal material from the metallic plate, for example by machining and/or etching the metallic plate at the border.

With the metallic plate having less metal material at the border as in a central part, a higher cycling reliability of the topside connection and/or an improved process stability and yield of a wire bonding interconnection may be achieved. This may satisfy an increasing power cycling lifetime demand, which may be needed to satisfy increasing current densities.

The substrate may be made of a plastics plate or a ceramics plate, which is layered at one or both sides with one or more metallization layers. The one or more metallization layers may be made of Cu. The metallization layer may be structured for providing electrical interconnections. For example, an electrical interconnection element bonded to the metallic plate also may be bonded to the metallization layer.

The power semiconductor chip may provide a semiconductor device, such as a diode, transistor and/or thyristor. The power semiconductor chip may be based on Si or SiC as semiconductor material. The power semiconductor chip may have metallic electrodes on one or both sides. With one power electrode, the power semiconductor chip may be bonded to the metallization layer of the substrate. The metallic plate may be bonded to an opposite power electrode.

In the case of a power semiconductor switch, such as a transistor or thyristor, the power semiconductor chip may have a further gate electrode, which may be provided on the same side, to which the metallic plate is bonded.

The metallic plate may be one-piece and/or may be made by machining and/or etching a preform. The metallic plate may be made of metal material.

According to an embodiment of the invention, metal material is removed from a side of the metallic plate providing the second surface. Depressions and/or holes may be provided on a side of the metallic plate (i.e. with the second surface), which is opposite to a side facing the power semiconductor chip (i.e. with the first surface). In such a way, the bonding area can be increased.

According to an embodiment of the invention, the first surface of the metallic plate covers more than 50%, for example more than 90% of an electrode of the power semiconductor chip. There may be one metallic plate for one electrode. The metallic plate may cover the electrode (nearly) completely.

According to an embodiment of the invention, the border surrounds the central part of the metallic plate. All sides of the metallic plate in directions parallel to the maximal extension of the metallic plate may be provided with a border having reduced metal material. In other words, the border may surround the central part completely.

However, it also may be that such a border is present, which surrounds the central part only partially.

According to an embodiment of the invention, the border of the metallic plate is thinner than the central part of the metallic plate and/or has a reduced thickness at the border. One possibility to reduce metal material at the border is to remove metal material over the complete area of the border. The metallic plate may have a thinner region close to its periphery, i.e. its border. A thinner structure at the border may have the advantage that the thermomechanical stress in a bond interface below may be significantly reduced compared to a metallic plate with an overall equal thickness. This advantage also was shown by thermomechanical simulations using a finite element method.

According to an embodiment of the invention, the border has depressions and/or holes, which may be provided in the second surface. A further possibility of reducing metal material is by removing metal material at dedicated areas of the border. The resulting depressions may reach to the edge of the metallic plate and/or may be completely surrounded by a higher area, i.e. may be holes. The depressions and/or holes may be distributed along all of the border.

According to an embodiment of the invention, the border has through holes. All or some of the depressions and/or holes may reach through the thickness of the metallic plate, i.e. the holes may be through holes. However, it also may be possible that all or some of the depressions and/or holes only reach partially through the thickness of the metallic plate. In this case, these holes may be seen as dimples and/or blind holes.

It has to be noted that a reduced thickness of the border may be combined with depressions and/or holes in the border. Furthermore, the border may have multiple different thicknesses. Any solution of a metallic plate with a reduced effective material mass in a region close to the edge of the metallic top plate may be used.

According to an embodiment of the invention, the border has a thickness of less than 100 μm, for example less than 50 μm.

According to an embodiment of the invention, the central part of the metallic plate has a thickness of more than 30 μm, for example more than 100 μm and/or more than 150 μm.

According to an embodiment of the invention, the central part of the metallic plate is flat. The central part may have a constant thickness. No areas with reduced metal material may be present in the central part.

As already mentioned, a plurality of metallic interconnection elements may be bonded to the metallic plate at the central part. The central part may be used for bonding further metal elements. For example, bond wires may be bonded to the central part and/or metallic bands may be bonded to the central part. A wire bond may have a substantially circular cross-section. A metallic band may have an elongated cross-section. For example, the diameter of the cross section in one direction may be 5 times larger than a diameter in another direction. A metallic band also may be called ribbon band.

According to an embodiment of the invention, the metallic plate is made of Cu. Also, the wire bond(s) and/or the metallic band(s) may be made of Cu.

It also may be possible to further reduce stress during thermal cycling by using a low-CTE material, such as molybdenum (Mo), for the metallic plate. However, Mo material may be considerably more expensive as Cu material.

A further aspect of the invention relates to a method of manufacturing a power semiconductor module. It has to be understood that features of the method as described in the above and in the following may be features of the power semiconductor module as described in the above and in the following, and vice versa.

According to an embodiment of the invention, the method comprises: bonding a power semiconductor chip to a metallization layer of a substrate; structuring a border of a metallic plate, such that the metallic plate has less metal material per area at the border as compared to a central part of the metallic plate; and bonding the metallic plate with a first surface to the power semiconductor chip opposite to the substrate. The central part and the border are bonded to the power semiconductor chip. In other words, the metal plate may be structured and bonded to the top of the power semiconductor chip, which is bonded with the other side to the substrate.

The method further comprises: bonding a plurality of interconnection elements to a second surface of the metallic plate at the central part of the metallic plate. In particular, the interconnection element, such as a wire bond or metallic band, may be welded to the metallic plate. Due to the reduced border structure, the central part may have an increased thickness, which may enable the bonding of thicker wire bonds or metallic bands. In such a way, a current capability of the topside connection may be increased.

According to an embodiment of the invention, the border of the metallic plate is structured with electrochemical etching. In particular, a structure with a thinner border may be implemented with a two-step etching process, which may be feasible at little additional cost. Also, a depression and/or hole structure may be implemented with etching.

According to an embodiment of the invention, the border of the metallic plate is structured by stamping. In particular, depressions and/or holes may be implemented with stamping.

According to an embodiment of the invention, the metallic plate is sintered to the power semiconductor chip. One possibility of bonding the metallic plate to an electrode of the power semiconductor chip is sintering. For example, the metallic plate, which may be made of Cu, may be sintered to the power semiconductor chip using a micro- or nanoparticle paste, which may comprise silver (Ag) and/or copper (Cu) particles.

However, it also may be possible to bond the metallic plate with another process, such as soldering.

According to an embodiment of the invention, the interconnection element is ultrasonic welded to the central part. For example, wire bonds and/or metallic bands may be ultrasonic welded to the central part.

According to an embodiment of the invention, the interconnection element is laser welded to the central part. A metal band may be laser welded to the central part. In the case of laser welding, it may be that the central part has a thickness of 100 μm or more.

In summary, a power semiconductor module with a highly reliable chip topside interconnection may be provided. A metallic top plate may be bonded to a topside of the power semiconductor chip, which may enable more reliable electric interconnections, such as Cu wire bonds. A thinner border structure and/or dimple border structure may be provided in the metallic top plate, which may improve the reliability of the bond interface between the metallic top plate and the power semiconductor chip. This may enable a use of thicker metallic top plates, which may be advantageous in terms of Cu wire bonding process stability and yield and may enable increased current capability of the topside connection by the use of thicker wire bonds or metal bands, such as ribbons.

These and other aspects of the invention will be apparent from and elucidated with reference to the embodiments described hereinafter.

BRIEF DESCRIPTION OF THE DRAWINGS

The subject matter of the invention will be explained in more detail in the following text with reference to exemplary embodiments which are illustrated in the attached drawings.

The reference symbols used in the drawings, and their meanings, are listed in summary form in the list of reference symbols. In principle, identical parts are provided with the same reference symbols in the figures.

DETAILED DESCRIPTION OF EXEMPLARY EMBODIMENTS

Figure 1:
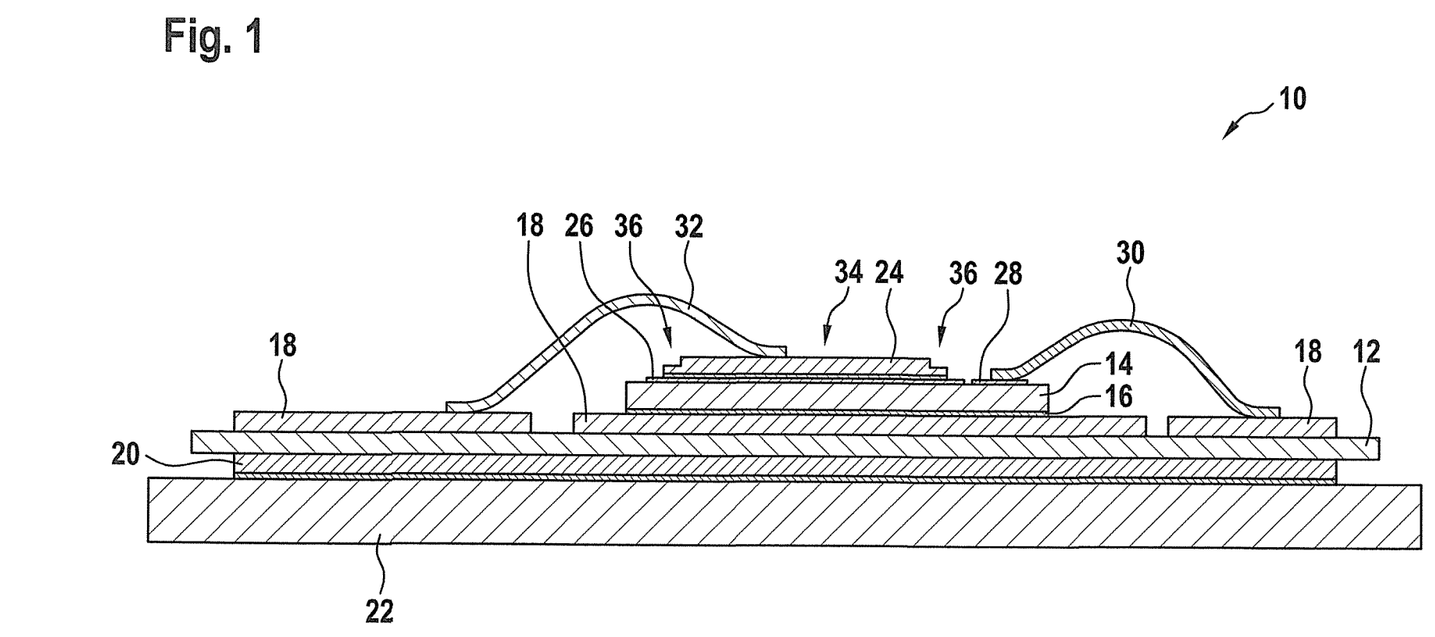
FIG. 1 schematically shows a cross-sectional view of a power semiconductor module according to an embodiment of the invention.

FIG. 1 shows a power semiconductor module 10 comprising a substrate 12, to which a power semiconductor chip 14 is bonded via a first (bottom) power electrode 16. For example, the power semiconductor chip 14 may provide a diode, thyristor and/or transistor. The electrode 16 may be a source or emitter electrode. The power semiconductor chip 14 may be based on Si or SiC.

The substrate 12 may have a (top side) metallization layer 18, to which the power semiconductor chip 14 is bonded, and may have a (bottom side) metallization layer 20 at an opposite side. With the metallization layer 20, the substrate 12 may be bonded to a baseplate 22 of the power semiconductor module 10. The metallization layer 18 may be structured to provide electrical connections of the power semiconductor chip 14 to other components of the power semiconductor module 10. The metallization layers 18, 20 may be made of Cu.

To the top side of the power semiconductor chip 14, a metallic plate 24 is bonded, which may be made of Cu or Mo. On the side opposite to the side, which is bonded to the metallization layer 18, the power semiconductor chip 14 has a further (top) power electrode 26, to which the metallic plate 24 is bonded. It also may be that the power semiconductor chip 14 has a gate electrode 28 at the same side as the power electrode 26. The electrodes 16, 26 and 28 may be made of Cu. The electrode 26 and optionally 28 may be thinner as the metallic plate 24, for example at least 5 times.

The gate electrode may be connected with a wire bond 30 to a part of the metallization layer 18. Also, the metallic plate 24 and therefore the power electrode 26 may be connected to a part of the metallization layer 18 with one or more further wire bonds 32, which may have a larger diameter as the wire bond 30.

The one or more further wire bonds 32 are bonded to a central part 34 of the metallic plate 24.

At a border 36, i.e. outside of the central part 34, the metallic plate 24 is structured in such a way that it has less metal material per area as compared to the central part 34.

At the border, the metallic plate 24 has reduced metal material. In the case shown in FIG. 1, the border 36 is thinner as the central part 34 in a direction orthogonal to the extension direction of the metallic plate 24 along the power semiconductor chip 14.

With such a border 36, i.e. a border 36 with reduced metal material, stress caused by thermic cycling may be reduced.

Figure 2:
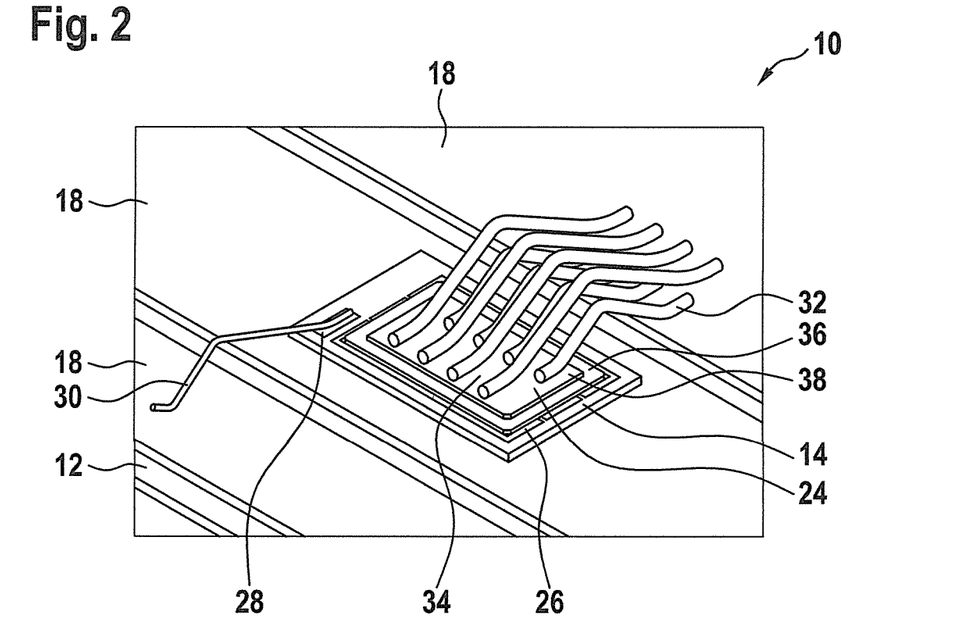
FIG. 2 schematically shows a perspective view of a power semiconductor module according to a further embodiment of the invention.

FIG. 2 shows a further embodiment of a power semiconductor module 10 with a border 36 with reduced metal material. Analogously to FIG. 1, the border 36 is thinner as the central part 34. The border 36 has an overall constant thickness. As shown, also the central part 34 may have a constant overall thickness. A rim 38 may be provided between the border 36 and the central part 34.

However, it also may be that a border 36 with reduced thickness is oblique and/or has varying thickness.

FIG. 2 also shows that the border 36 surrounds the central part 34 completely. Furthermore, a width of the border 36 may be the same on all lateral sides of the metallic plate 24.

Figure 3:
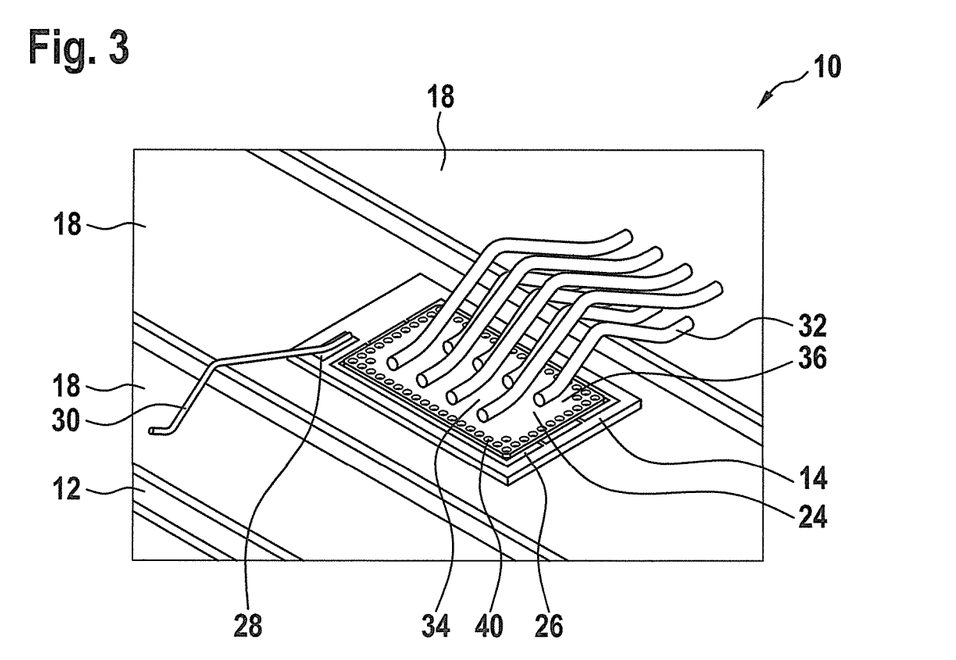
FIG. 3 schematically shows a perspective view of a power semiconductor module according to a further embodiment of the invention.

FIG. 3 shows that the border 36 may have the same thickness as the central part 34, but that the metal material of the metallic plate 24 is reduced at the border 36 by providing the border with dimples and/or holes 40. The dimples and/or holes 40 may surround the central part 34 in one or more rows.

Figure 4:
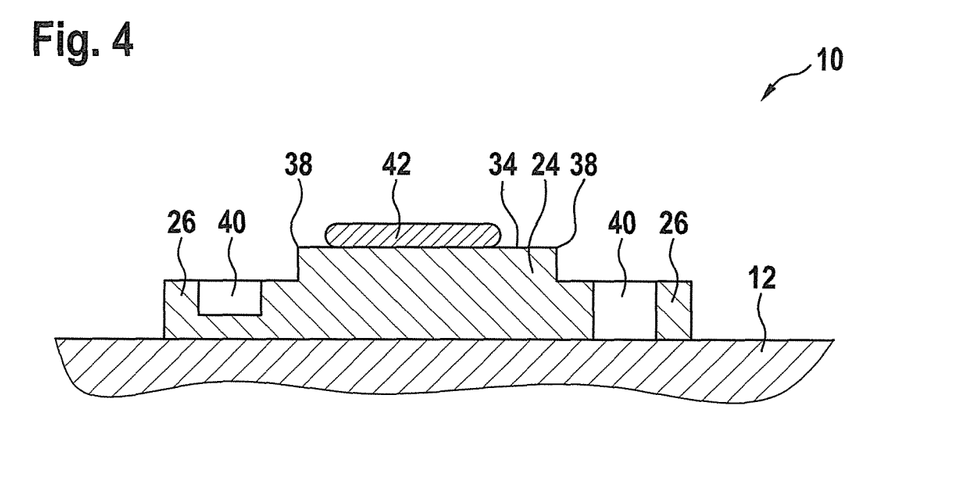
FIG. 4 schematically shows a cross-sectional view of a power semiconductor module according to a further embodiment of the invention.

FIG. 4 shows that the dimples and/or holes 40 may reach only partially through the thickness of the border 36 or may reach completely through the thickness of the border 36, i.e. may be through holes. Additionally, as shown in FIG. 4, a reduced border thickness may be combined with dimples and/or holes 40.

FIG. 4 also shows that a metallic band 42 may be bonded to the central part 34. It has to be noted that such a metallic band 42 may also be used in the other embodiments shown in FIG. 1 to 6 instead or additionally to wire bonds 32.

Figure 5:
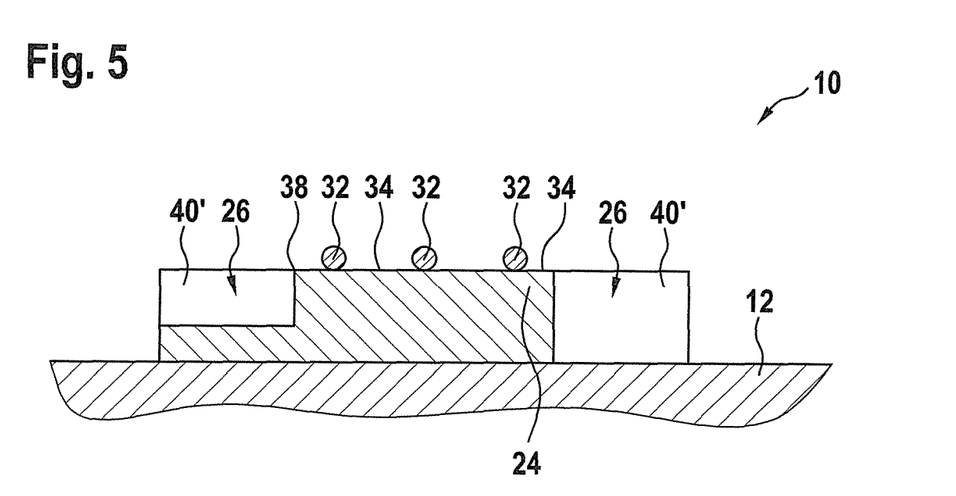
FIG. 5 schematically shows a cross-sectional view of a power semiconductor module according to a further embodiment of the invention.

In FIG. 5, other types of depressions 40' are shown, which may reach only partially through the thickness of the border 36 or may reach completely through the thickness of the border 36. Again, the thickness of the border 36 may be equal or smaller compared with the thickness of the central part 34.

Figure 6:
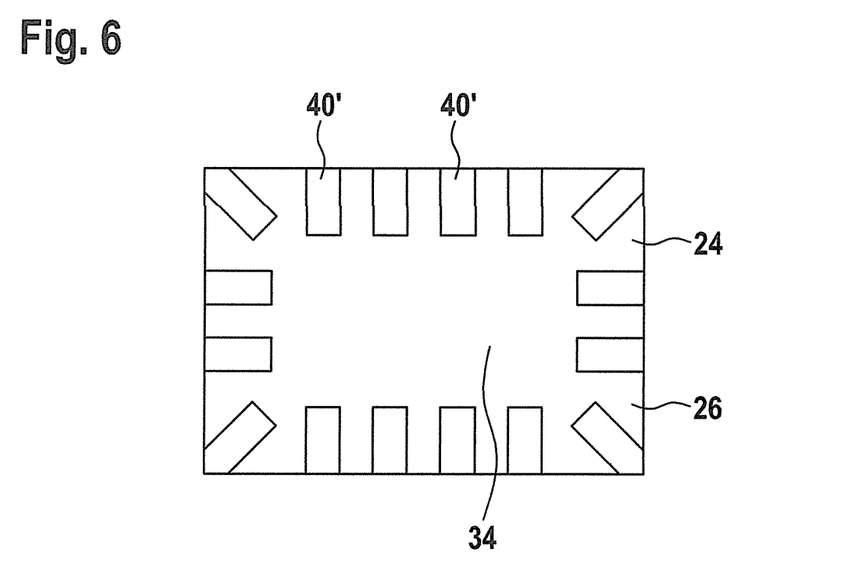
FIG. 6 schematically shows a top view of a power semiconductor module according to a further embodiment of the invention.

As shown in FIG. 6, the depressions 40' may be arranged in a row around the central part 34, which row may completely surround the central part. Contrary to holes 40, depressions 40' may extend to the edge of the metallic plate 24.

Figure 7:
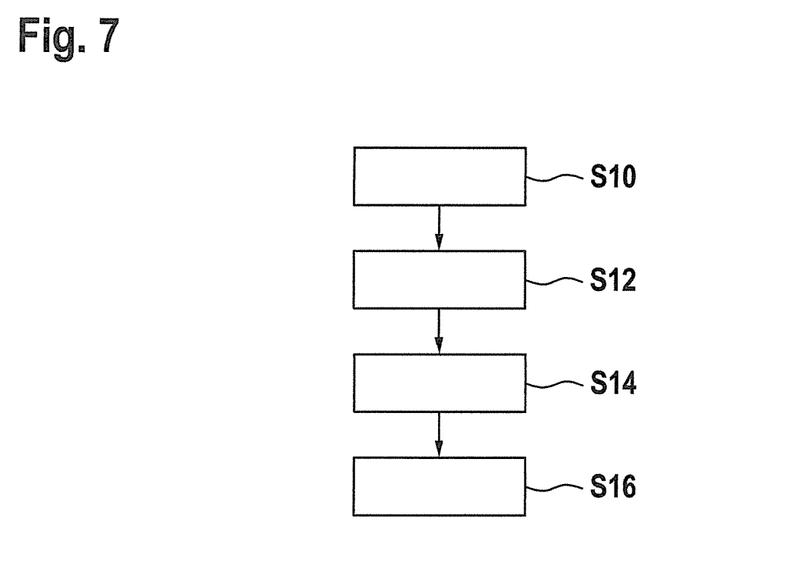
FIG. 7 shows a flow diagram for a method for manufacturing a power semiconductor module according to an embodiment of the invention.

FIG. 7 shows a flow diagram for a method for manufacturing a power semiconductor module 10 as shown in FIG. 1 to 6.

In step S10, the power semiconductor chip 14 is bonded with its power electrode 16 to the metallization layer 18 of the substrate 12. This bonding may be performed by soldering or sintering. The same sintering process as described with respect to step S14 may be used.

In step S12, the border 36 of the metallic plate 24 is structured, such that the metallic plate 24 has less metal material per area at a border 36 as compared to the central part 34 of the metallic plate 24.

The border 36 of the metallic plate 24 may be structured with electrochemical etching. A border 36 of different thickness, as shown in FIG. 1 to 4, may be produced with electrochemical etching. Depressions 40' and/or holes 40, as shown with respect to FIG. 3 to 6, may be produced with electrochemical etching.

The border 36 of the metallic plate 24 additionally or alternatively is structured by stamping. Depressions 40' and/or holes 40, as shown with respect to FIG. 3 to 6, may be produced with electrochemical etching.

In step S14, the metallic plate 24 is bonded to the power semiconductor chip 14 opposite to the substrate 12.

The metallic plate 24 is sintered to the power semiconductor chip 14. For example, the metallic plate 24 may be sintered to the power semiconductor chip 14 with nanoparticles, for example made of Ag or Cu.

In step S16, one or more of the interconnection elements 32, 42 are bonded to the central part 34 of the metallic plate 24.

For example, an interconnection element 32, 42, such as a wire bond 32, may be ultrasonic welded to the central part 34. It also may be that an interconnection element 32, 42, such as a metal band 42, is laser welded to the central part 34.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art and practising the claimed invention, from a study of the drawings, the disclosure, and the appended claims. In the claims, the word "comprising" does not exclude other elements or steps, and the indefinite article "a" or "an" does not exclude a plurality. A single processor or controller or other unit may fulfil the functions of several items recited in the claims. The mere fact that certain measures are recited in mutually different dependent claims does not indicate that a combination of these measures cannot be used to advantage. Any reference signs in the claims should not be construed as limiting the scope.

LIST OF REFERENCE SYMBOLS

10 power semiconductor module
12 substrate
14 power semiconductor chip
16 power electrode
18 metallization layer
20 metallization layer
22 baseplate
24 metallic plate
26 power electrode
28 gate electrode
30 wire bond
32 wire bond
34 central part
36 border
38 rim
40 hole
40' depression
42 metallic band

The invention claimed is:

1. A power semiconductor module, comprising:
a substrate with a metallization layer;
a power semiconductor chip bonded to the metallization layer of the substrate;
a metallic plate with a first surface bonded to a surface of the power semiconductor chip opposite to the substrate, the metallic plate having a central part and a border that are both bonded to the power semiconductor chip, wherein the border of the metallic plate is structured in such a way that the metallic plate has less metal material per volume at the border as compared to the central part of the metallic plate; and a plurality of metallic interconnection elements bonded to a second surface of the metallic plate at the central part.

2. The power semiconductor module of claim 1, wherein the first surface of the metallic plate covers more than 50% of an electrode of the power semiconductor chip.

3. The power semiconductor module of claim 1, wherein the border of the metallic plate is thinner than the central part of the metallic plate.

4. The power semiconductor module of claim 1, wherein the border has depressions in the second surface or has holes in the second surface.

5. The power semiconductor module of claim 4, wherein the central part of the metallic plate is flat.

6. The power semiconductor module of claim 4, wherein the border has through holes.

7. The power semiconductor module of claim 1, wherein the border of the metallic plate has a thickness of less than 100 μm.

8. The power semiconductor module of claim 1, wherein the central part of the metallic plate has a thickness of more than 30 μm.

9. The power semiconductor module of claim 1, wherein the central part of the metallic plate is flat.

10. The power semiconductor module of claim 1, wherein the metallic interconnection elements comprise bond wires are bonded to the central part or metallic bands.

11. The power semiconductor module of claim 1, wherein the metallic plate is made of copper.

12. A power semiconductor module, comprising:
a substrate with a metallization layer;
a power semiconductor chip bonded to the metallization layer of the substrate;
a metallic plate bonded having a central part and a border that are both bonded to a surface of the power semiconductor chip opposite to the substrate, wherein the central part of the metallic plate is structured differently than the border of the metallic plate so that thermal stresses at the border are lower during operation of the power semiconductor module and so that the central part of the metallic plate has a lower resistivity than the border of the metallic plate; and
a plurality of metallic interconnection elements bonded to a second surface of the metallic plate at the central part.

13. The power semiconductor module of claim 12, wherein the border of the metallic plate is thinner than the central part of the metallic plate.

14. The power semiconductor module of claim 12, wherein the border has depressions or holes and wherein the central part of the metallic plate is flat.

15. A method of manufacturing a power semiconductor module, the method comprising:
bonding a power semiconductor chip to a metallization layer of a substrate;
structuring a border of a metallic plate, such that the metallic plate has less metal material per volume at the border as compared to a central part of the metallic plate;
bonding a first surface of the metallic plate to the power semiconductor chip opposite to the substrate, wherein the central part and the border are both bonded to the power semiconductor chip; and
attaching a plurality of interconnection elements to a second surface of the metallic plate at the central part of the metallic plate.

16. The method of claim 15, wherein structuring the border of the metallic plate comprises performing electrochemical etching.

17. The method of claim 15, wherein structuring the border of the metallic plate comprises stamping.

18. The method of claim 15, wherein bonding the metallic plate to the power semiconductor chip comprises sintering the metallic plate to the power semiconductor chip.

19. The method of claim 15, attaching the interconnection elements comprises ultrasonic welding the interconnection elements to the central part.

20. The method of claim 15, wherein attaching the interconnection elements comprises laser welding the interconnection elements to the central part.

* * * * *